United States Patent
Ning et al.

(10) Patent No.: US 10,242,886 B2
(45) Date of Patent: Mar. 26, 2019

(54) METHOD FOR FABRICATING ARRAY SUBSTRATE

(71) Applicant: BOE TECHNOLOGY GROUP CO., LTD., Beijing (CN)

(72) Inventors: Ce Ning, Beijing (CN); Wei Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/569,728

(22) PCT Filed: Apr. 12, 2017

(86) PCT No.: PCT/CN2017/080221
§ 371 (c)(1),
(2) Date: Oct. 26, 2017

(87) PCT Pub. No.: WO2017/185988
PCT Pub. Date: Nov. 2, 2017

(65) Prior Publication Data
US 2018/0247833 A1    Aug. 30, 2018

(30) Foreign Application Priority Data
Apr. 28, 2016 (CN) .......................... 2016 1 0278667

(51) Int. Cl.
*H01L 21/477* (2006.01)
*H01L 21/77* (2017.01)
(Continued)

(52) U.S. Cl.
CPC ............ *H01L 21/477* (2013.01); *H01L 21/77* (2013.01); *H01L 27/12* (2013.01);
(Continued)

(58) Field of Classification Search
CPC ......... E03C 1/298; F16K 15/031; E03F 5/042
See application file for complete search history.

(56) References Cited

U.S. PATENT DOCUMENTS 8,309,961 B2 * 11/2012 Yamazaki .......... H01L 27/1225
257/59
2015/0349139 A1    12/2015 Liu

FOREIGN PATENT DOCUMENTS

CN          103400765      *   7/2013
CN          103400765  A      11/2013
(Continued)

OTHER PUBLICATIONS

"First office action," CN Application No. 201610278667.7 (dated May 3, 2018).
(Continued)

*Primary Examiner* — Karen Kusumakar
(74) *Attorney, Agent, or Firm* — Womble Bond Dickinson (US) LLP

(57) ABSTRACT

A method for fabricating an array substrate is disclosed. The method comprises: forming a first oxide semiconductor active layer of a first TFT in a GOA area of a substrate; performing a first annealing process on the first oxide semiconductor active layer at a first temperature; forming a first insulating layer which covers the first oxide semiconductor active layer; performing a second annealing process on the first oxide semiconductor active layer at a second temperature, wherein the second temperature is lower than the first temperature. This improves a forward bias stability of the first TFT and increases the device lifetime.

14 Claims, 7 Drawing Sheets

(51) Int. Cl.
  *H01L 27/12* (2006.01)
  *H01L 29/66* (2006.01)
  *H01L 29/786* (2006.01)

(52) U.S. Cl.
  CPC ...... *H01L 27/1225* (2013.01); *H01L 27/1259* (2013.01); *H01L 29/66969* (2013.01); *H01L 29/7869* (2013.01)

(56) References Cited

FOREIGN PATENT DOCUMENTS

| CN | 103715201 A | 4/2014 |
|---|---|---|
| CN | 105870057 A | 8/2016 |

OTHER PUBLICATIONS

International Search Report and Written Opinion in PCT/CN2017/080221 dated Jul. 12, 2017, with English translation.

* cited by examiner

METHOD FOR FABRICATING ARRAY SUBSTRATE

RELATED APPLICATIONS

The present application is the U.S. national phase entry of PCT/CN2017/080221, with an international filing date of Apr. 12, 2017, which claims the benefit of Chinese Patent Application No. 201610278667.7, filed on Apr. 28, 2016, the entire disclosures of which are incorporated herein by reference.

TECHNICAL FIELD

The present disclosure relates to the field of display technology, and particularly to a method for fabricating an array substrate.

BACKGROUND

An oxide semiconductor thin film transistor (TFT) refers to a TFT in which an active layer comprises an oxide semiconductor material. In the field of display, the oxide semiconductor TFT has been popular due to its advantages of a high mobility, a high uniformity, a transparent property, and a simple fabricating process for meeting requirements of a display device. The display device comprises a pixel area TFT and a gate driver on array (GOA) area TFT. The GOA area TFT is used to control signals input from a gate line. The GOA area TFT is subject to a significant forward bias, and is prone to a forward bias drifting which may lead to failure.

SUMMARY

In embodiments of the present disclosure, it is an object to provide a method for fabricating array substrate, which intends to alleviate or solve one or more of the above problems or other problems.

In a first aspect, a method for fabricating an array substrate is proposed, comprising:

forming a first oxide semiconductor active layer of a first TFT in a GOA area of a substrate;

performing a first annealing process on the first oxide semiconductor active layer at a first temperature;

forming a first insulating layer which covers the first oxide semiconductor active layer; and performing a second annealing process on the first oxide semiconductor active layer at a second temperature, wherein the second temperature is lower than the first temperature.

Optionally, prior to forming the first oxide semiconductor active layer of the first TFT in the GOA area of the substrate, the method further comprises: forming a first gate of the first TFT in the GOA area of the substrate, and a second insulating layer which covers the first gate, wherein the first oxide semiconductor active layer is arranged above the second insulating layer; and after performing the first annealing process on the first oxide semiconductor active layer at the first temperature, and prior to forming the first insulating layer which covers the first oxide semiconductor active layer, the method further comprises: forming a first source and a first drain of the first TFT which are arranged above the first oxide semiconductor active layer.

Optionally, after performing the second annealing process on the first oxide semiconductor active layer at the second temperature, the method further comprises:

forming a first gate of the first TFT which is arranged on the first insulating layer and which is arranged above the first oxide semiconductor active layer;

forming a first via and a second via, respectively, which penetrate the first insulating layer and expose the first oxide semiconductor active layer;

depositing a metal in the first via and the second via, respectively, to form a first source and a first drain of the first TFT which are arranged above the first oxide semiconductor active layer; and forming a second insulating layer which covers the first gate, the first source, and the first drain.

Optionally, performing the second annealing process on the first oxide semiconductor active layer at the second temperature comprises:

irradiating a mask plate which exposes a region covered by an orthographic projection of the first TFT on the substrate, with infrared light or excimer laser at the second temperature, to perform the second annealing process on the first oxide semiconductor active layer.

Optionally, performing the second annealing process on the first oxide semiconductor active layer at the second temperature comprises:

irradiating a mask plate which exposes a region covered by an orthographic projection of the first oxide active layer on the substrate, with infrared light or excimer laser at the second temperature, to perform the second annealing process on the first oxide semiconductor active layer.

Optionally, performing the second annealing process on the first oxide semiconductor active layer at the second temperature comprises:

irradiating a mask plate which exposes a region covered by an orthographic projection of a channel area of the first oxide semiconductor active layer on the substrate, with infrared light or excimer laser at the second temperature, to perform the second annealing process on the first oxide semiconductor active layer.

Optionally, the first temperature is in a range of 300-400° C., and the second temperature is in a range of 200-300° C.

Optionally, the first annealing process has a first duration, the second annealing process has a second duration, the first duration is in a range of 1 h-3 h, and the second duration is in a range of 0.5 h-1.5 h.

Optionally, the first duration is about 1 h, and the second duration is about 1 h.

Optionally, prior to performing the second annealing process on the first oxide semiconductor active layer at the second temperature, the method further comprises: forming a second oxide semiconductor active layer of a second TFT in a pixel area of the substrate, and performing the first annealing process on the second oxide semiconductor active layer at the first temperature; and wherein performing the second annealing process on the first oxide semiconductor active layer at the second temperature comprises: performing the second annealing process on the first oxide semiconductor active layer at the second temperature, and keeping the second oxide semiconductor active layer away from the second annealing process;

or, after performing the second annealing process on the first oxide semiconductor active layer at the second temperature, the method further comprises: forming a second oxide semiconductor active layer of a second TFT in a pixel area of the substrate; performing the first annealing process on the second oxide semiconductor active layer at the first temperature, and keeping the first oxide semiconductor active layer away from the first annealing process.

Optionally, forming the second oxide semiconductor active layer of the second TFT in the pixel area of the substrate comprises: forming the second oxide semiconductor active layer of the second TFT in the pixel area of the substrate, at a same time as forming the first oxide semiconductor active layer of the first TFT in the GOA area of the substrate;

wherein performing the first annealing process on the second oxide semiconductor active layer at the first temperature comprises: at a same time as performing the first annealing process on the first oxide semiconductor active layer at the first temperature, performing the first annealing process on the second oxide semiconductor active layer at the first temperature;

the method further comprises: at a same time as forming the first insulating layer which covers the first oxide semiconductor active layer, forming a third insulating layer which covers the second oxide semiconductor active layer, wherein the third insulating layer and the first insulating layer are of a same layer.

Optionally, prior to forming the second oxide semiconductor active layer of the second TFT in the pixel area of the substrate, the method further comprises:

forming a second gate of the second TFT in the pixel area of the substrate, and a fourth insulating layer which covers the second gate, wherein the fourth insulating layer and the second insulating layer are of a same layer, and the second oxide semiconductor active layer is arranged on the fourth insulating layer;

after the step of at a same time as performing the first annealing process on the first oxide semiconductor active layer at the first temperature, performing the first annealing process on the second oxide semiconductor active layer at the first temperature, and prior to forming which the third insulating layer covers the second oxide semiconductor active layer, the method further comprises: forming a first source and a first drain of the second TFT which are arranged on the second oxide semiconductor active layer.

Optionally, after the step of at a same time as performing the first annealing process on the first oxide semiconductor active layer at the first temperature, performing the first annealing process on the second oxide semiconductor active layer at the first temperature, the method further comprises:

forming a second gate of the second TFT which is arranged on the third insulating layer and which is arranged above the second oxide semiconductor active layer;

forming a third via and a fourth via, respectively, which penetrate the third insulating layer and expose the second oxide semiconductor active layer;

depositing a metal in the third via and the fourth via, respectively, to form a second source and a second drain of the second TFT which are arranged on the second oxide semiconductor active layer; and forming a fourth insulating layer which covers the second gate, the second source, and the second drain, wherein the fourth insulating layer and the second insulating layer are of a same layer.

In a second aspect, an array substrate is proposed, which is fabricated by any one of the above method.

In a third aspect, a display device is proposed, which comprises the above array substrate.

DETAILED DESCRIPTION OF EMBODIMENTS

A method for fabricating an array substrate of the present disclosure will be described in detail hereinafter with reference to the accompanying drawings.

Figure 1:
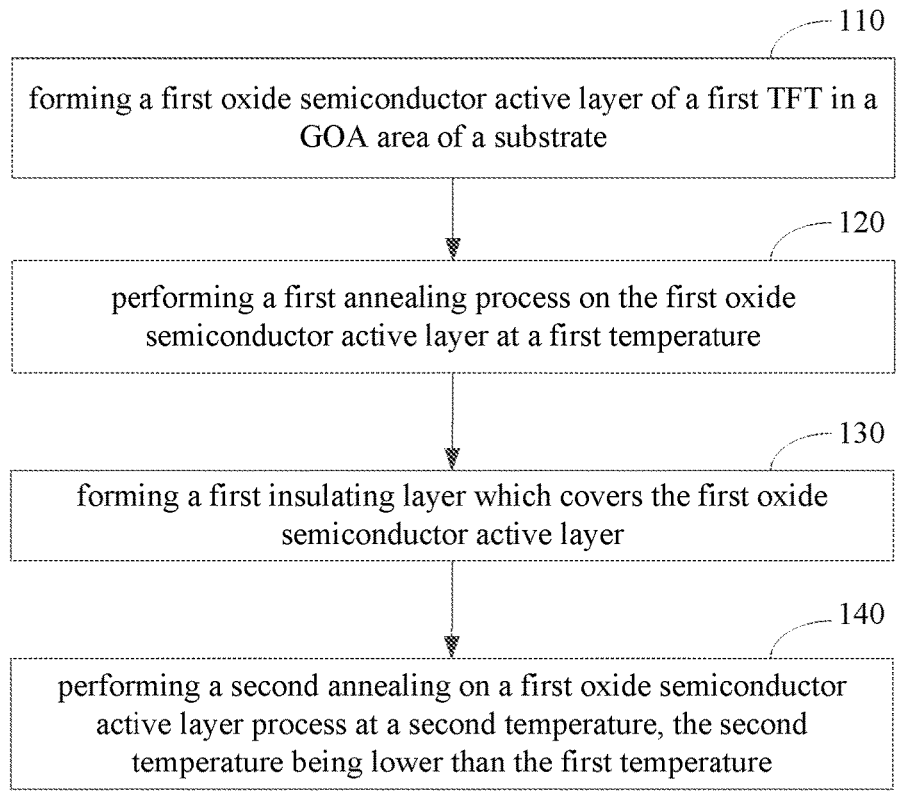
FIG. 1 is a schematic flow chart for illustrating a method for fabricating an array substrate according to embodiments of the present disclosure.

As shown in FIG. 1, in an embodiment of the present disclosure, a method for fabricating an array substrate at least comprises the following steps.

Step 110, forming a first oxide semiconductor active layer of a first TFT in a GOA area of a substrate.

Step 120, performing a first annealing process on the first oxide semiconductor active layer at a first temperature. In this step, annealing is performed on the first oxide semiconductor active layer for a first time.

Step 130, forming a first insulating layer which covers the first oxide semiconductor active layer.

Step 140, performing a second annealing on a first oxide semiconductor active layer process at a second temperature, the second temperature being lower than the first temperature. In this step, annealing is performed on the first oxide semiconductor active layer for a second time.

In embodiments of the present disclosure, annealing is performed after forming a first oxide semiconductor active layer, and a second annealing is performed after forming a first insulating layer which covers the first oxide semiconductor active layer. The annealing is performed on the first oxide semiconductor active layer at a second temperature which is lower than the first temperature. After annealing, the forward bias drifting amount of the first TFT is reduced, which improves a forward bias stability of the first TFT and increases the device lifetime.

Apart from the first oxide semiconductor active layer, the first TFT further comprises a first gate, a first source, and a first drain. In practice, the first TFT may be a top-gate TFT or a bottom-gate TFT. In different structures, the first TFT is formed in different steps, which are described hereinafter.

Figure 2:
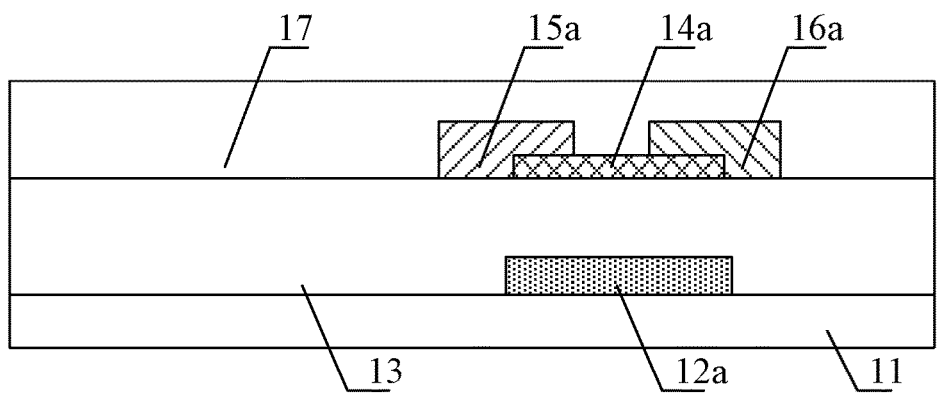
FIG. 2 is structural view for illustrating a first TFT according to embodiments of the present disclosure.

In a possible embodiment, the bottom-gate TFT has a specific structure shown in FIG. 2. The bottom-gate TFT comprises a first gate 12a in a GOA area of a substrate 11, a second insulating layer 13 which covers the first gate 12a, a first oxide semiconductor active layer 14a which is arranged on the second insulating layer 13 and which is arranged above the first gate 12a, a first source 15a and a first drain 16a which are arranged above the first oxide semiconductor active layer 14a, and a first insulating layer 17 which covers the first oxide semiconductor active layer 14a and covers the first source 15a and the first drain 16a. The first insulating layer 17 is the topmost layer and acts as a protection layer. The second insulating layer 13 is arranged between the first oxide semiconductor active layer 14a and the first gate 12a and acts as a gate insulating layer.

On basis of the first TFT shown in FIG. 2, the method for fabricating the array substrate optionally further comprises: prior to forming the first oxide semiconductor active layer of the first TFT in the GOA area of the substrate in step 110, forming a first gate of the first TFT in the GOA area of the substrate and a second insulating layer which covers the first gate, wherein the first oxide semiconductor active layer is arranged on the second insulating layer. After performing the first annealing process on the first oxide semiconductor active layer at the first temperature in step 120, and prior to forming the first insulating layer which covers the first oxide semiconductor active layer in step 130, the method further comprises: forming the first source and the first drain of the first TFT which are arranged on the first oxide semiconductor active layer.

Figure 3:
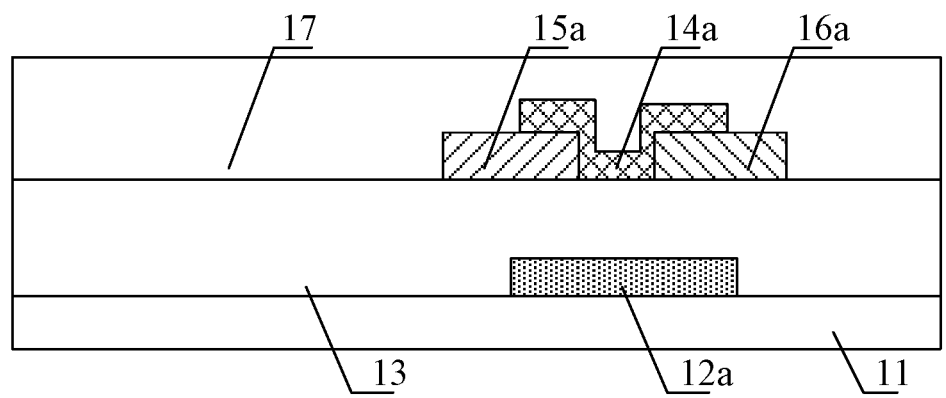
FIG. 3 is a structural view for illustrating another first TFT according to embodiments of the present disclosure.

In the bottom-gate TFT of the above embodiment, as shown in FIG. 3, it is possible that the first oxide semiconductor active layer 14a is arranged on the first source 15a, the first drain 16a, and the second insulating layer 13. As for the method for fabricating this TFT, reference can be made to the method for fabricating the TFT shown in FIG. 2.

Figure 4:
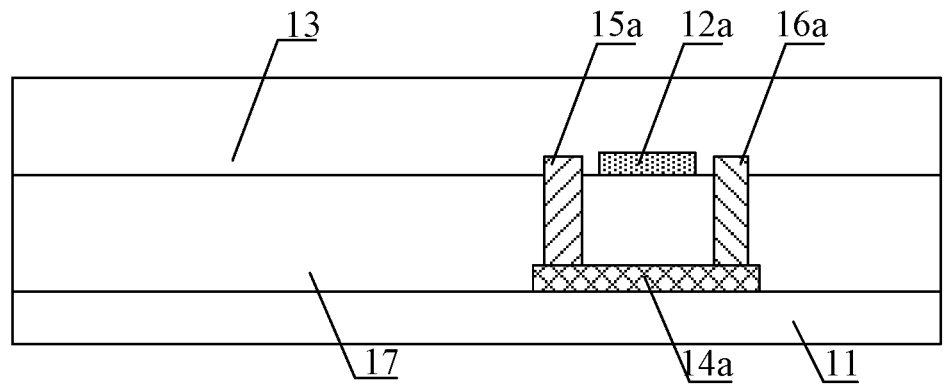
FIG. 4 is a structural view for illustrating yet another first TFT according to embodiments of the present disclosure.

In a possible embodiment, the top-gate TFT has a specific structure shown in FIG. 4. The top-gate TFT comprises the first oxide semiconductor active layer 14a in the GOA area of the substrate 11, the first source 15a and the first drain 16a which are arranged on the first oxide semiconductor active layer 14a, the first insulating layer 17 which covers the first oxide semiconductor active layer 14a, the first gate 12a which is arranged on the first insulating layer 17 and which is arranged above the first oxide semiconductor active layer 14a, and the second insulating layer 13 which covers the first gate 12a and covers the first source 15a and the first drain 16a. The second insulating layer 13 is the topmost layer and acts as a protection layer. The first insulating layer 17 is arranged between the first oxide semiconductor active layer 14a and the first gate 12a and acts as a gate insulating layer.

On basis of the first TFT shown in FIG. 4, the method for fabricating the array substrate optionally further comprises: after performing the second annealing on the first oxide semiconductor active layer process at the second temperature in step 140, forming the first gate first TFT which is arranged on the first insulating layer and which is arranged above the first oxide semiconductor active layer; forming a first via and a second via, respectively, which penetrate the first insulating layer and expose the first oxide semiconductor active layer; depositing a metal in the first via and the second via, respectively, to form the first source and the first drain of the first TFT which are arranged on the first oxide semiconductor active layer; and forming a second insulating layer which covers the first gate, the first source, and the first drain.

In practice, optionally, performing the second annealing on the first oxide semiconductor active layer process at the second temperature in step 140 can be implemented in various manners, some of which are described hereinafter.

Figure 5:
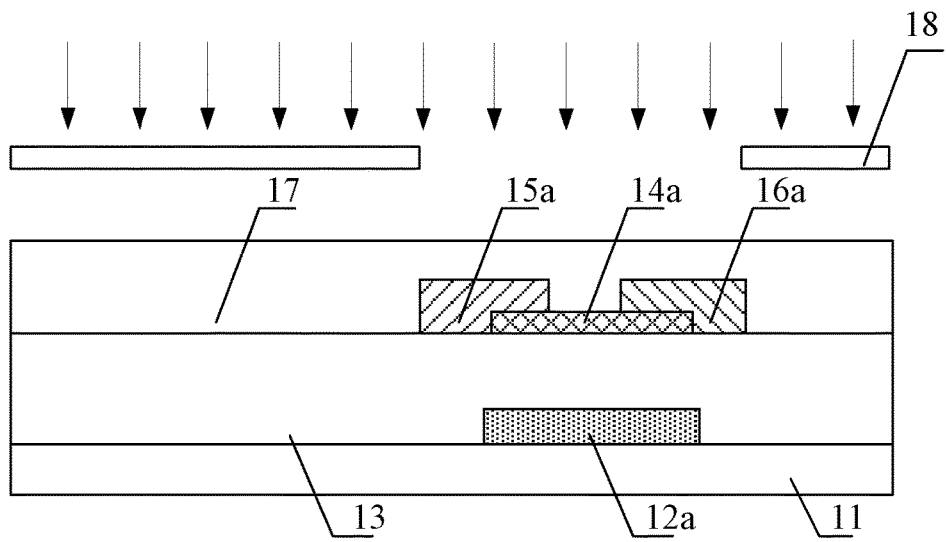
FIG. 5 is a schematic view for illustrating a second annealing on a first oxide semiconductor active layer according to embodiments of the present disclosure.

In an implementation of step 140, as shown in FIG. 5, a mask plate 18 exposes a region which is covered by an orthographic projection of the first TFT on the substrate, and the mask plate 18 is irradiated with infrared light or excimer laser at the second temperature to perform the second annealing process on the first oxide semiconductor active layer.

Figure 6:
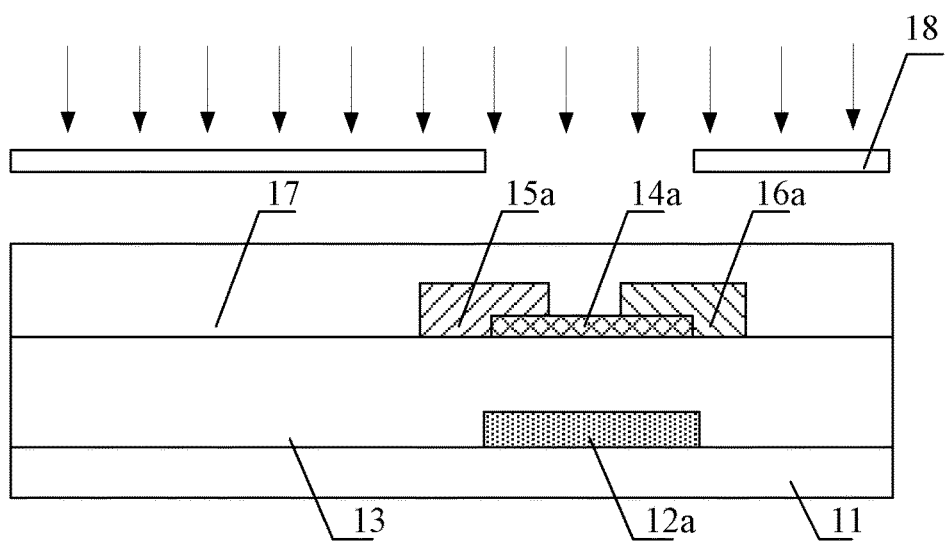
FIG. 6 is a schematic view for illustrating another second annealing on a first oxide semiconductor active layer according to embodiments of the present disclosure.

In another implementation of step 140, as shown in FIG. 6, the mask plate 18 exposes a region which is covered by an orthographic projection of the first oxide active layer on the substrate, and the mask plate 18 is irradiated with infrared light or excimer laser at the second temperature to perform the second annealing process on the first oxide semiconductor active layer.

Figure 7:
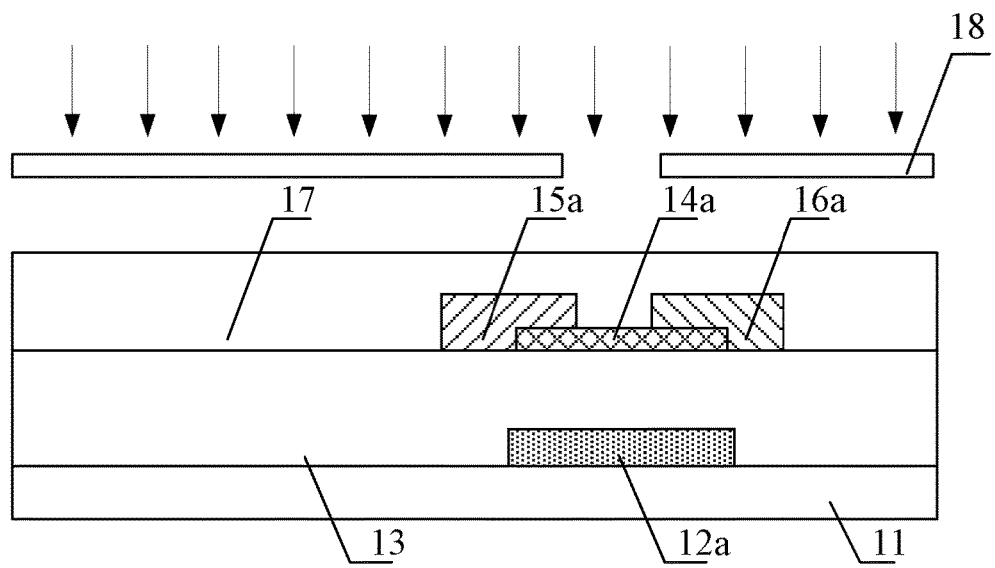
FIG. 7 is a schematic view for illustrating yet another second annealing on a first oxide semiconductor active layer according to embodiments of the present disclosure.

In yet another implementation of step 140, as shown in FIG. 7, the mask plate 18 exposes a region which is covered by an orthographic projection of a channel area of the first oxide semiconductor active layer on the substrate, and the mask plate 18 is irradiated with infrared light or excimer laser at the second temperature to perform the second annealing process on the first oxide semiconductor active layer.

In the above relevant embodiments, the mask plate is used to shield the substrate to different extents, so as to realize the second annealing on the first oxide semiconductor active layer. Here, two annealing modes with infrared light and excimer laser are taken as examples, and other optional annealing modes can be employed. Furthermore, performing the first annealing process on the first oxide semiconductor active layer at the first temperature in step 120 can be implemented by annealing with infrared light, or by conventional annealing with hot wind, resistance wire heating, or the like.

Generally, the TFT in the GOA area of the substrate is susceptible to a forward bias, while the technical solutions of the above embodiments can improve its forward bias stability. The TFT in the pixel area of the substrate is susceptible to a negative bias, which requires negative bias stability. However, the inventors found that the negative bias stability of the TFT in the pixel area of the substrate will be affected if the second annealing is performed on the TFT in the pixel area of the substrate. Thus, it is required to keep the TFT in the pixel area away from the second annealing, so as to preventing the second annealing from affecting its negative bias stability. For example, the mask plate can be used for shielding in a similar manner with the above embodiments. Furthermore, when the first annealing is performed on the TFT in the pixel area of the substrate, the TFT in the GOA area on which the second annealing has been performed may potentially be affected. Thus, it is also required to keep the TFT in the GOA area away from the first annealing. For example, the mask plate can also be used for shielding. The TFT in the pixel area of the substrate can be a top-gate TFT or a bottom-gate TFT. The TFT will be described hereinafter by referring to specific structures.

Optionally, prior to performing the second annealing on the first oxide semiconductor active layer process at the second temperature in step 140, the method further comprises: forming a second oxide semiconductor active layer of a second TFT in a pixel area of the substrate; performing the first annealing process on the second oxide semiconductor active layer at the first temperature; and performing the second annealing on the first oxide semiconductor active layer process at the second temperature in step 140. In particular, performing the second annealing on the first oxide semiconductor active layer process at the second temperature comprises: performing the second annealing on the first oxide semiconductor active layer process at the second temperature, and keeping the second oxide semiconductor active layer away from the second annealing process. The technical solutions of the present embodiment are applicable to a case in which both the first TFT and the second TFT are of a top-gate type, a case in which both the first TFT and the second TFT are of a bottom-gate type, and a case in which the first TFT is a bottom-gate type and the second TFT is a top-gate type. During performing the second annealing on the first oxide semiconductor active layer of the first TFT in the GOA area, the second oxide semiconductor active layer of the second TFT in the pixel area is kept away from the second annealing, which avoids influence on its negative bias stability.

Alternatively, after performing the second annealing on the first oxide semiconductor active layer process at the second temperature in step 140, the method further comprises: forming a second oxide semiconductor active layer of a second TFT in the pixel area of the substrate; performing the first annealing process on the second oxide semiconductor active layer at the first temperature, and keeping the first oxide semiconductor active layer away from the first annealing process. The technical solution of the present embodiment is applicable to a case in which the first TFT is a top-gate type and the second TFT is a bottom-gate type. When the first annealing is performed on the second oxide semiconductor active layer of the second TFT in the pixel area of the substrate, the first oxide semiconductor active layer of the first TFT in the GOA area is kept away from the first annealing, so as to prevent the first annealing from affecting the first oxide semiconductor active layer of the first TFT in the GOA area on which the second annealing has been performed.

As for the case in which both the first and second TFT are a top-gate type, or both the first and second TFT are a bottom-gate type, optionally, the step of forming the second oxide semiconductor active layer of the second TFT in the pixel area of the substrate comprises: at a same time as forming the first oxide semiconductor active layer of the first TFT in the GOA area of the substrate, forming the second oxide semiconductor active layer of the second TFT in the pixel area of the substrate. Accordingly, performing the first annealing process on the second oxide semiconductor active layer at the first temperature particularly comprises: at a same time as performing the first annealing process on the first oxide semiconductor active layer at the first temperature, performing the first annealing process on the second oxide semiconductor active layer at the first temperature. The method further comprises: at a same time as forming the first insulating layer which covers the first oxide semiconductor, forming a third insulating layer which covers the second oxide semiconductor active layer, wherein the third insulating layer and the first insulating layer are of a same layer.

In case both the first and second TFT are a bottom-gate type, optionally, prior to forming the second oxide semiconductor active layer of the second TFT in the pixel area of the substrate, the method further comprises: forming a second gate of the second TFT in the pixel area of the substrate and a fourth insulating layer which covers the second gate, wherein the fourth insulating layer and the second insulating layer are of a same layer. The second oxide semiconductor active layer is arranged on the fourth insulating layer. Accordingly, prior to the step of, at a same time as performing the first annealing process on the first oxide semiconductor active layer at the first temperature, performing the first annealing process on the second oxide semiconductor active layer at the first temperature, the method further comprises: forming a first source and a first drain of the second TFT which are arranged on the second oxide semiconductor active layer.

Alternatively, in the second TFT, the second oxide semiconductor active layer is arranged on the second source, the second drain, and the fourth insulating layer. The second TFT can be fabricated by a similar method with the above embodiments.

In case both the first and second TFT are a top-gate type, optionally, after the step of, at a same time as performing the first annealing process on the first oxide semiconductor active layer at the first temperature, performing the first annealing process on the second oxide semiconductor active layer at the first temperature, the method further comprises: forming a second gate of the second TFT which is arranged on the third insulating layer and which is arranged above the second oxide semiconductor active layer; forming a third via and a fourth via, respectively, which penetrate the third insulating layer and expose the second oxide semiconductor active layer; depositing a metal in the third via and the fourth via, respectively, to form a second source and a second drain of the second TFT which are arranged on the second oxide semiconductor active layer; and forming a fourth insulating layer which covers the second gate, the second source, and the second drain, wherein the fourth insulating layer and the second insulating layer are of a same layer.

In case the first TFT is a bottom-gate type and the second TFT is a top-gate type, optionally, prior to performing the second annealing on the first oxide semiconductor active layer process at the second temperature, and after performing the first annealing process on the second oxide semiconductor active layer at the first temperature, the method further comprises: forming third insulating layer which covers the second oxide semiconductor active layer; forming a second gate which is arranged on the third insulating layer and which is arranged above the second oxide semiconductor active layer; forming a third via and a fourth via, respectively, which penetrate the third insulating layer and expose the second oxide semiconductor active layer; depositing a metal in the third via and the fourth via, respectively, to form a second source and a second drain of the second TFT which are arranged on the second oxide semiconductor active layer; and forming a fourth insulating layer which covers the second gate, the second source, and the second drain.

In case the first TFT is a top-gate type and the second TFT is a bottom-gate type, optionally, prior to forming the second oxide semiconductor active layer of the second TFT in the pixel area of the substrate, the method further comprises: forming a second gate of the second TFT in the pixel area of the substrate and a fourth insulating layer which covers the second gate, wherein the second oxide semiconductor active layer is arranged on the fourth insulating layer; after performing the first annealing process on the second oxide semiconductor active layer at the first temperature, the method further comprises: forming a second source and a second drain which are arranged on the second oxide semiconductor active layer; forming a third insulating layer which covers the second oxide semiconductor active layer, the second source, and the second drain.

Optionally, on basis of any one of the above embodiments, the first temperature is in a range of 300-400° C., and the second temperature is in a range of 200-300° C.

Optionally, the first temperature is 380° C., and the second temperature is 280° C.

Optionally, the first annealing process has a first duration, and the second annealing process has a second duration. The first duration is in a range of 0.5 h-2 h, and the second duration is in a range of 0.5 h-1.5 h.

Optionally, the first duration is about 1 h, and the second duration is about 1 h.

Optionally, in the above related embodiments, the first oxide semiconductor active layer and the second oxide semiconductor active layer comprise, but are not limited to, Zinc Oxide (ZnO), Indium Zinc Oxide (IZO), Indium Gallium Zinc Oxide (IGZO), and Indium Tin Zinc Oxide (ITZO).

Optionally, in the above related embodiments, the first insulating layer and the second insulating layer comprise, but are not limited to, Silicon Nitride (SiNx), Silicon Oxide (SiOx), and Silicon Oxynitride (SiON).

The method for fabricating an array substrate according to embodiments of the present disclosure will be described in detail hereinafter, by taking a case in which both the first TFT and the second TFT are a bottom-gate TFT as an example.

Figure 8:
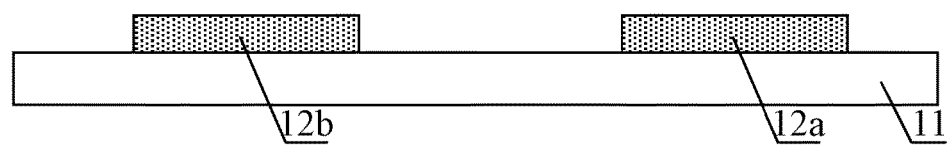
FIG. 8 is a structural view for illustrating forming a first gate and a second gate during fabricating an array substrate according to embodiments of the present disclosure.

Step 1, a metal layer is deposited on the substrate, and as shown in FIG. 8, a first gate 12a of a first TFT in the GOA area of the substrate is formed, a second gate 12b of a second TFT is formed in the pixel area of the substrate, and gate lines (not shown) are formed, by performing a patterning process for one time.

Figure 9:
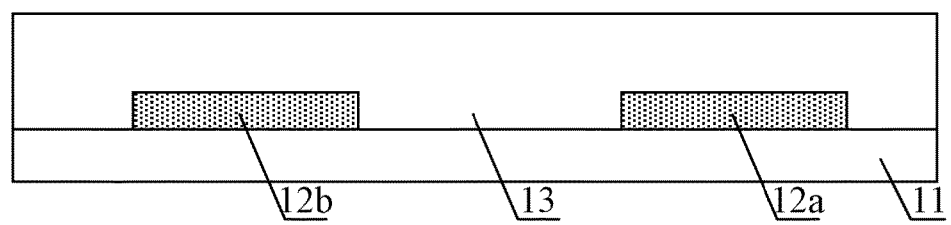
FIG. 9 is a structural view for illustrating forming a second insulating layer during fabricating an array substrate according to embodiments of the present disclosure.

Step 2, as shown in FIG. 9, a second insulating layer 13 which covers the first gate 12a and the second gate 12b is deposited on the substrate.

In this step, the second insulating layer comprises, but is not limited to, SiNx, SiOx, and SiON.

Figure 10:
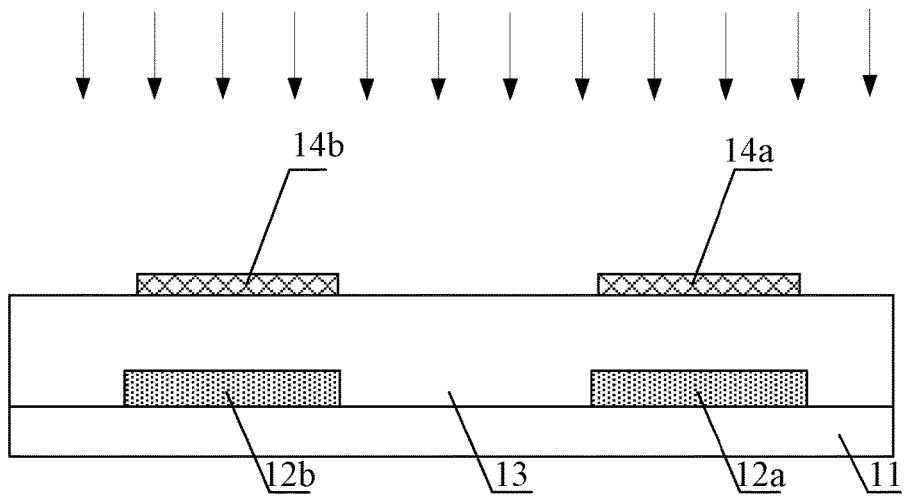
FIG. 10 is a structural view for illustrating forming a first oxide semiconductor active layer and a second oxide semiconductor active layer and annealing a substrate, during fabricating an array substrate according to embodiments of the present disclosure.

Step 3, an oxide semiconductor film is deposited on the substrate, and as shown in FIG. 10, a first oxide semiconductor active layer 14a which is arranged on the second insulating layer 13 and which is arranged above the first gate 12a is formed, and a second oxide semiconductor active layer 14b which is arranged on the second insulating layer 13 and which is arranged above the second gate 12b is formed, by performing a patterning process for one time.

In this step, the first oxide semiconductor active layer and the second oxide semiconductor active layer comprise, but are not limited to, ZnO, IZO, IGZO, ITZO.

Step 4, as shown in FIG. 10, a first annealing process is performed on the substrate on which the first oxide semiconductor active layer 14a and the second oxide active layer 14b have been formed, by irradiating with infrared light at a first temperature.

In this step, a first annealing is performed on the first oxide semiconductor active layer 14a. The first temperature is 380° C., and the first duration is 1 h.

Figure 11:
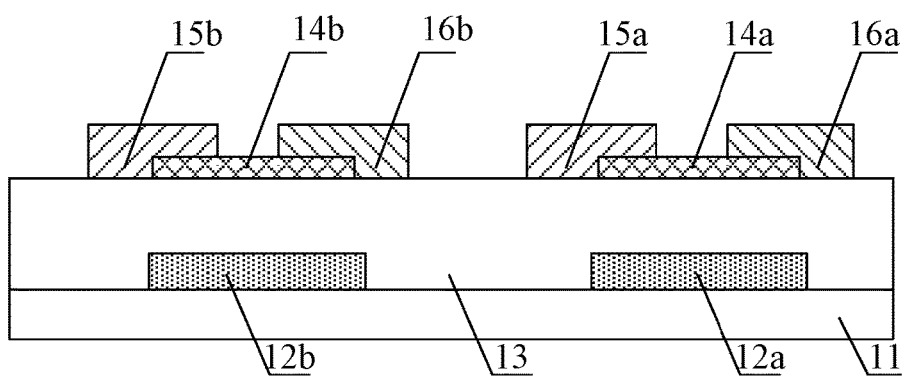
FIG. 11 is a structural view for illustrating forming a first source, a first drain, a second source, and a second drain, during fabricating an array substrate according to embodiments of the present disclosure.

Step 5, a metal layer is deposited by magnetron sputtering on the substrate on which the first oxide semiconductor active layer 14a and the second oxide semiconductor active layer 14b have been formed. As shown in FIG. 11, a first source 15a and a first drain 16a which are arranged on the first oxide semiconductor active layer 14a are formed, a second source 15b and a second drain 16b which are arranged on the second oxide semiconductor active layer 14b are formed, and data lines (not shown) are formed, by performing a patterning process for one time.

Figure 12:
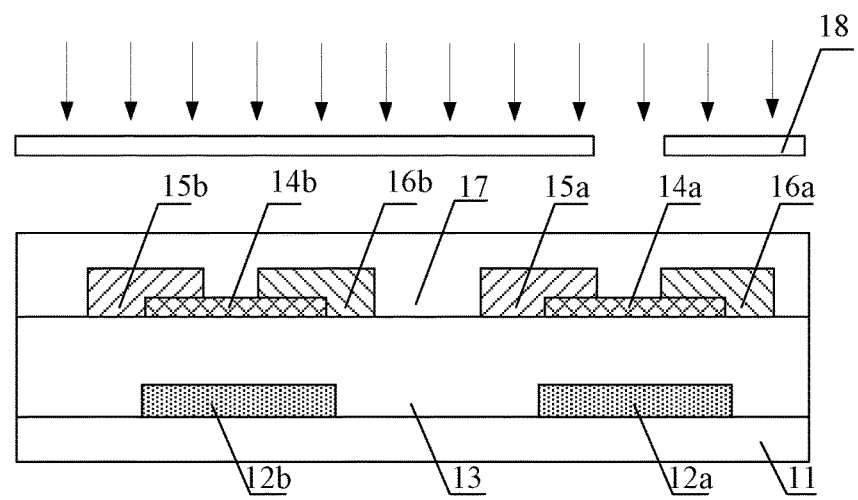
FIG. 12 is a structural view for illustrating forming a first insulating layer and performing a second annealing on a first oxide semiconductor active layer, during fabricating an array substrate according to embodiments of the present disclosure.

Step 6, as shown in FIG. 12, a first insulating layer 17 is formed, which covers the first oxide semiconductor active layer 14a, the second oxide semiconductor active layer 14b, the first source 15a, the first drain 15b, the second source 16a, and the second drain 16b.

In this step, the first insulating layer comprises, but is not limited to, SiNx, SiOx, and SiON.

Step 7, as shown in FIG. 12, a mask plate is installed. The mask plate only exposes a region covered by an orthographic projection of a channel area of the first oxide semiconductor active layer 14a on the substrate, and the second oxide semiconductor active layer 14b is shielded by the mask plate.

Step 8, as shown in FIG. 12, the mask plate is irradiated with infrared light at the second temperature, so as to performing the second annealing process only on the first oxide semiconductor active layer 14a.

In this step, the second annealing is performed on the first oxide semiconductor active layer 14a, but is not performed on the second oxide semiconductor active layer 14b. The second temperature is 280° C., and the second duration is 1 h.

Figure 13:
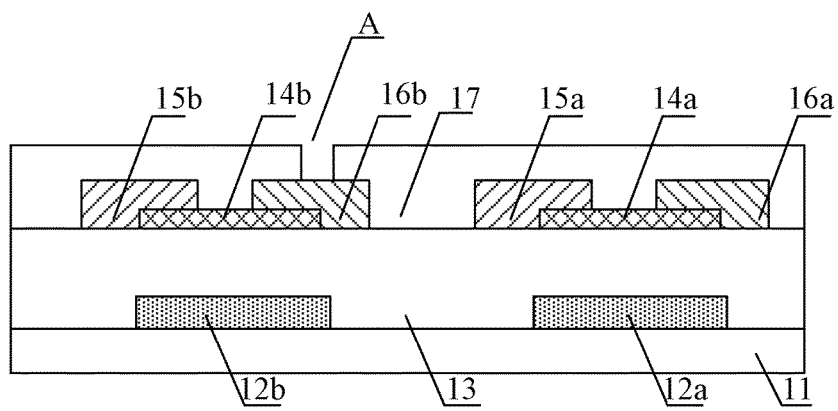
FIG. 13 is a structural view for illustrating forming a fifth via in a first insulating layer, during fabricating an array substrate according to embodiments of the present disclosure.

Step 9, as shown in FIG. 13, a fifth via A is formed by a patterning process, which penetrates the first insulating layer and exposes the second drain 16b.

Figure 14:
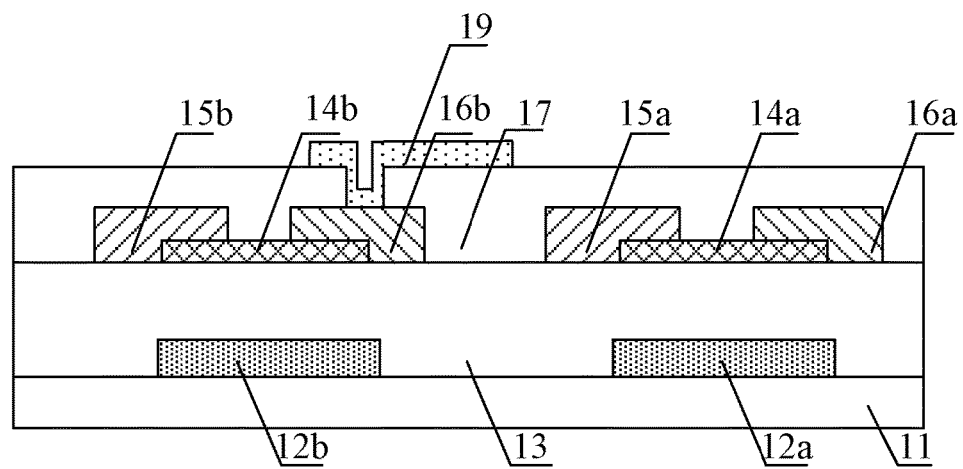
FIG. 14 is a structural view for illustrating forming a pixel electrode, during fabricating an array substrate according to embodiments of the present disclosure.

Step 10, as shown in FIG. 14, a transparent electrically conductive film is deposited on the first insulating layer 17 in which the fifth via A has been formed, and a pixel electrode 19 which is connected with the second drain 16b through the fifth via A is formed by performing a patterning process for one time.

In the first TFT resulting from the above steps, the first oxide semiconductor active layer has been annealed for two times, so that the forward bias stability of the first TFT is improved and meets the requirement of the GOA area of the substrate. When the second annealing is performed on the first oxide semiconductor active layer, the second oxide semiconductor active layer is shielded and is not subject to the second annealing. Thus, the negative bias stability of the resulting second TFT will not be affected, and meets the requirements of the pixel area of the substrate.

On basis of the same inventive concept, embodiments of the present disclosure further provide an array substrate which is fabricated by the method as described above.

On basis of the same inventive concept, embodiments of the present disclosure further provide a display device which comprises the array substrate as described above.

According to the method for fabricating an array substrate in embodiments of the present disclosure, annealing is performed after forming a first oxide semiconductor active layer, and a second annealing is performed after forming a first insulating layer which covers the first oxide semiconductor active layer. The annealing is performed on the first oxide semiconductor active layer at a second temperature which is lower than the first temperature. After annealing, the forward bias drifting amount of the first TFT is reduced, which improves a forward bias stability of the first TFT and increases the device lifetime.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A method for fabricating an array substrate, comprising:
   forming a first oxide semiconductor active layer of a first TFT in a GOA area of a substrate;
   performing a first annealing process on the first oxide semiconductor active layer at a first temperature;
   forming a first insulating layer which covers the first oxide semiconductor active layer; and
   performing a second annealing process on the first oxide semiconductor active layer at a second temperature, wherein the second temperature is lower than the first temperature,
   wherein performing the second annealing process on the first oxide semiconductor active layer at the second temperature comprises:
   irradiating a mask plate which exposes a region covered by an orthographic projection of the first TFT on the substrate, a mask plate which exposes a region covered b an orthographic projection of the first oxide active layer on the substrate, or a mask plate which exposes a region covered by an orthographic projection of a channel area of the first oxide semiconductor active layer on the substrate, with infrared light or excimer laser at the second temperature, to perform the second annealing process on the first oxide semiconductor active layer.

2. The method of claim 1, wherein prior to forming the first oxide semiconductor active layer of the first TFT in the GOA area of the substrate, the method further comprises: forming a first gate of the first TFT in the GOA area of the substrate, and a second insulating layer which covers the first gate, wherein the first oxide semiconductor active layer is arranged above the second insulating layer; and
   after performing the first annealing process on the first oxide semiconductor active layer at the first temperature, and prior to forming the first insulating layer which covers the first oxide semiconductor active layer, the method further comprises: forming a first source and a first drain of the first TFT which are arranged above the first oxide semiconductor active layer.

3. The method of claim 1, wherein after performing the second annealing process on the first oxide semiconductor active layer at the second temperature, the method further comprises:
   forming a first gate of the first TFT which is arranged on the first insulating layer and which is arranged above the first oxide semiconductor active layer;
   forming a first via and a second via, respectively, which penetrate the first insulating layer and expose the first oxide semiconductor active layer;
   depositing a metal in the first via and the second via, respectively, to form a first source and a first drain of the first TFT which are arranged above the first oxide semiconductor active layer; and
   forming a second insulating layer which covers the first gate, the first source, and the first drain.

4. The method of claim 1, wherein the first temperature is in a range of 300-400° C., and the second temperature is in a range of 200-300° C.

5. The method of claim 4, wherein the first annealing process has a first duration, the second annealing process has a second duration, the first duration is in a range of 1 h-3 h, and the second duration is in a range of 0.5 h-1.5 h.

6. The method of claim 5, wherein the first duration is about 1 h, and the second duration is about 1 h.

7. The method of claim 1, wherein prior to performing the second annealing process on the first oxide semiconductor active layer at the second temperature, the method further comprises: forming a second oxide semiconductor active layer of a second TFT in a pixel area of the substrate, and performing the first annealing process on the second oxide semiconductor active layer at the first temperature; and
   wherein performing the second annealing process on the first oxide semiconductor active layer at the second temperature comprises: performing the second annealing process on the first oxide semiconductor active layer at the second temperature, and keeping the second oxide semiconductor active layer away from the second annealing process.

8. The method of claim 7, wherein forming the second oxide semiconductor active layer of the second TFT in the pixel area of the substrate comprises:
   forming the second oxide semiconductor active layer of the second TFT in the pixel area of the substrate, at a same time as forming the first oxide semiconductor active layer of the first TFT in the GOA area of the substrate;
   wherein performing the first annealing process on the second oxide semiconductor active layer at the first temperature comprises: at a same time as performing the first annealing process on the first oxide semiconductor active layer at the first temperature, performing the first annealing process on the second oxide semiconductor active layer at the first temperature;

The method of claim 7, wherein forming the second oxide semiconductor active layer of the second TFT in the pixel area of the substrate comprises: forming the second oxide semiconductor active layer of the second TFT in the pixel area of the substrate, at a same time as forming the first oxide semiconductor active layer of the first TFT in the GOA area of the substrate;
   wherein performing the first annealing process on the second oxide semiconductor active layer at the first temperature comprises: at a same time as performing the first annealing process on the first oxide semiconductor active layer at the first temperature, performing the first annealing process on the second oxide semiconductor active layer at the first temperature;
   the method further comprises: at a same time as forming the first insulating layer which covers the first oxide semiconductor active layer, forming a third insulating layer which covers the second oxide semiconductor active layer, wherein the third insulating layer and the first insulating layer are of a same layer.

9. The method of claim 8, wherein prior to forming the second oxide semiconductor active layer of the second TFT in the pixel area of the substrate, the method further comprises:
   forming a second gate of the second TFT in the pixel area of the substrate, and a fourth insulating layer which covers the second gate, wherein the fourth insulating layer and the second insulating layer are of a same layer, and the second oxide semiconductor active layer is arranged on the fourth insulating layer;

after the step of at a same time as performing the first annealing process on the first oxide semiconductor active layer at the first temperature, performing the first annealing process on the second oxide semiconductor active layer at the first temperature, and prior to forming which the third insulating layer covers the second oxide semiconductor active layer, the method further comprises: forming a first source and a first drain of the second TFT which are arranged on the second oxide semiconductor active layer.

10. The method of claim 8, wherein after the step of at a same time as performing the first annealing process on the first oxide semiconductor active layer at the first temperature, performing the first annealing process on the second oxide semiconductor active layer at the first temperature, the method further comprises:

forming a second gate of the second TFT which is arranged on the third insulating layer and which is arranged above the second oxide semiconductor active layer;

forming a third via and a fourth via, respectively, which penetrate the third insulating layer and expose the second oxide semiconductor active layer;

depositing a metal in the third via and the fourth via, respectively, to form a second source and a second drain of the second TFT which are arranged on the second oxide semiconductor active layer; and forming a fourth insulating layer which covers the second gate, the second source, and the second drain, wherein the fourth insulating layer and the second insulating layer are of a same layer.

11. The method of claim 1, wherein after performing the second annealing process on the first oxide semiconductor active layer at the second temperature, the method further comprises: forming a second oxide semiconductor active layer of a second TFT in a pixel area of the substrate; performing the first annealing process on the second oxide semiconductor active layer at the first temperature, and keeping the first oxide semiconductor active layer away from the first annealing process.

12. The method of claim 11, wherein forming the second oxide semiconductor active layer of the second TFT in the pixel area of the substrate comprises:

forming the second oxide semiconductor active layer of the second TFT in the pixel area of the substrate, at a same time as forming the first oxide semiconductor active layer of the first TFT in the GOA area of the substrate;

wherein performing the first annealing process on the second oxide semiconductor active layer at the first temperature comprises: at a same time as performing the first annealing process on the first oxide semiconductor active layer at the first temperature, performing the first annealing process on the second oxide semiconductor active layer at the first temperature;

the method further comprises: at a same time as forming the first insulating layer which covers the first oxide semiconductor active layer, forming a third insulating layer which covers the second oxide semiconductor active layer, wherein the third insulating layer and the first insulating layer are of a same layer.

13. The method of claim 12, wherein prior to forming the second oxide semiconductor active layer of the second TFT in the pixel area of the substrate, the method further comprises:

forming a second gate of the second TFT in the pixel area of the substrate, and a fourth insulating layer which covers the second gate, wherein the fourth insulating layer and the second insulating layer are of a same layer, and the second oxide semiconductor active layer is arranged on the fourth insulating layer;

after the step of at a same time as performing the first annealing process on the first oxide semiconductor active layer at the first temperature, performing the first annealing process on the second oxide semiconductor active layer at the first temperature, and prior to forming which the third insulating layer covers the second oxide semiconductor active layer, the method further comprises: forming a first source and a first drain of the second TFT which are arranged on the second oxide semiconductor active layer.

14. The method of claim 12, wherein after the step of at a same time as performing the first annealing process on the first oxide semiconductor active layer at the first temperature, performing the first annealing process on the second oxide semiconductor active layer at the first temperature, the method further comprises:

forming a second gate of the second TFT which is arranged on the third insulating layer and which is arranged above the second oxide semiconductor active layer;

forming a third via and a fourth via, respectively, which penetrate the third insulating layer and expose the second oxide semiconductor active layer;

depositing a metal in the third via and the fourth via, respectively, to form a second source and a second drain of the second TFT which are arranged on the second oxide semiconductor active layer; and forming a fourth insulating layer which covers the second gate, the second source, and the second drain, wherein the fourth insulating layer and the second insulating layer are of a same layer.

* * * * *